United States Patent
Usami

(10) Patent No.: US 10,446,419 B2
(45) Date of Patent: Oct. 15, 2019

(54) SEMICONDUCTOR MANUFACTURING APPARATUS

(71) Applicant: Toshiba Memory Corporation, Minato-ku (JP)

(72) Inventor: Tatsumi Usami, Kuwana (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 15/265,071

(22) Filed: Sep. 14, 2016

(65) Prior Publication Data
US 2017/0263474 A1    Sep. 14, 2017

Related U.S. Application Data

(60) Provisional application No. 62/306,712, filed on Mar. 11, 2016.

(51) Int. Cl.
*H01L 21/67* (2006.01)

(52) U.S. Cl.
CPC .. *H01L 21/67248* (2013.01); *H01L 21/67109* (2013.01)

(58) Field of Classification Search
CPC .......... H01L 21/67109; H01L 21/67248; H01J 37/32724; H01J 2237/2001
See application file for complete search history.

(56) References Cited

U.S. PATENT DOCUMENTS

| | | | | |
|---|---|---|---|---|
| 7,789,962 B2 * | 9/2010 | Iwasaki | ............... | G05D 23/1902 118/728 |
| 2002/0186967 A1 * | 12/2002 | Ramanan | .......... | H01L 21/67103 392/418 |
| 2003/0070316 A1 * | 4/2003 | Weed | ................ | H01L 21/67109 34/107 |
| 2004/0163601 A1 * | 8/2004 | Kadotani | .......... | H01J 37/32724 118/728 |
| 2004/0187787 A1 * | 9/2004 | Dawson | ............... | C23C 16/4586 118/728 |
| 2010/0116788 A1 * | 5/2010 | Singh | ................... | C23C 16/4586 216/66 |
| 2012/0000612 A1 * | 1/2012 | Odagiri | ................. | C23C 16/401 156/382 |
| 2014/0004706 A1 * | 1/2014 | Miya | .................... | H01L 21/3065 438/710 |

FOREIGN PATENT DOCUMENTS

| | | |
|---|---|---|
| JP | 5-102166 | 4/1993 |
| JP | 3527032 | 5/2004 |

\* cited by examiner

*Primary Examiner* — Eric S Ruppert
(74) *Attorney, Agent, or Firm* — Oblon, McClelland, Maier & Neustadt, L.L.P.

(57) ABSTRACT

A semiconductor manufacturing apparatus according to the present embodiment includes a first cooler, a second cooler, and a temperature controller. The first cooler includes a first placing portion that can place a central portion of a semiconductor substrate thereon, and cools the central portion by heat exchange with the first placing portion. The second cooler includes a second placing portion that can place a peripheral portion of the semiconductor substrate thereon in a periphery of the first placing portion, and cools the peripheral portion. The temperature controller controls a temperature of the second placing portion to be lower than a temperature of the semiconductor substrate and to be higher than a temperature of the first placing portion.

3 Claims, 3 Drawing Sheets

SEMICONDUCTOR MANUFACTURING APPARATUS

CROSS REFERENCE TO RELATED APPLICATIONS

This application is based upon and claims the benefit of priority from the prior U.S. Provisional Patent Application No. 62/306,712 filed on Mar. 11, 2016, the entire contents of which are incorporated herein by reference.

FIELD

The embodiments of the present invention relate to a semiconductor manufacturing apparatus.

BACKGROUND

In a film-forming process of a semiconductor device, a wafer is processed at a high temperature. The wafer processed at a high temperature is placed on a cooling plate and is cooled, before being carried to the subsequent step of the film-forming process.

However, conventional techniques have a problem that the wafer is cracked when being cooled on a cooling plate.

DETAILED DESCRIPTION

A semiconductor manufacturing apparatus according to an embodiment includes a first cooler, a second cooler, and a temperature controller. The first cooler includes a first placing portion that can place a central portion of a semiconductor substrate thereon, and cools the central portion by heat exchange with the first placing portion. The second cooler includes a second placing portion that can place a peripheral portion of the semiconductor substrate thereon in a periphery of the first placing portion, and cools the peripheral portion. The temperature controller controls a temperature of the second placing portion to be lower than a temperature of the semiconductor substrate and to be higher than a temperature of the first placing portion.

Embodiments will now be explained with reference to the accompanying drawings. The present invention is not limited to the embodiments.

First Embodiment

First, as a first embodiment, there is described an embodiment in which a central portion and a peripheral portion of a semiconductor substrate are respectively cooled on placing portions having a mutually different temperature.

Figure 1:
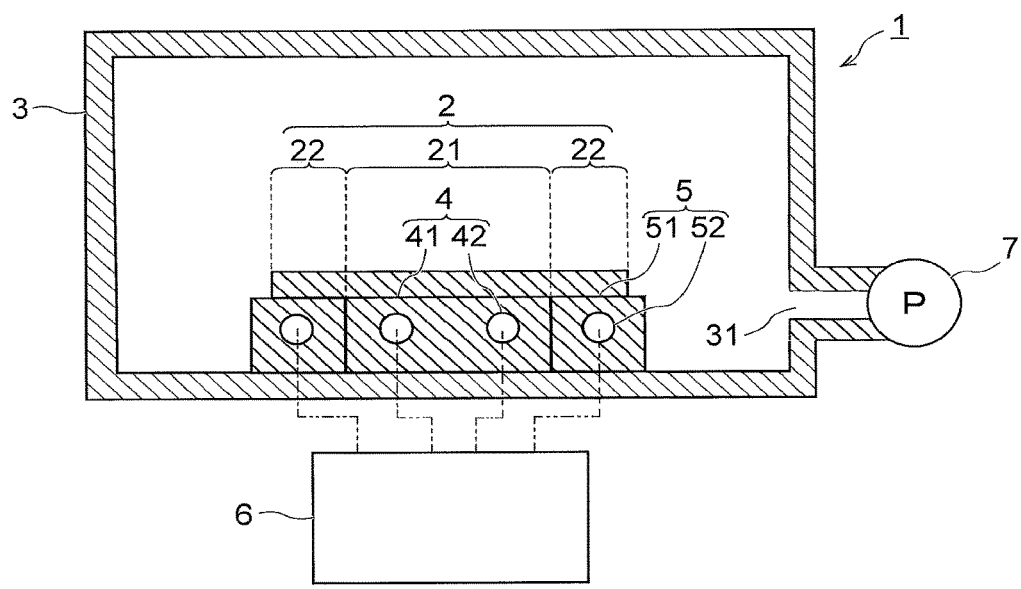
FIG. 1 is a schematic sectional view showing a semiconductor manufacturing apparatus according to a first embodiment.

FIG. 1 is a schematic sectional view showing a semiconductor manufacturing apparatus 1 according to the first embodiment. The semiconductor manufacturing apparatus 1 in FIG. 1 can be used in a manufacturing process of a semiconductor device in order to cool a semiconductor substrate 2 having been processed in a high-temperature film-forming process, before the semiconductor substrate 2 is carried to the subsequent step.

As shown in FIG. 1, the semiconductor manufacturing apparatus 1 includes a chamber 3 as an example of a container, a first cooler 4, a second cooler 5, a chiller unit 6 as an example of a temperature controller, and a pump 7 as an example of an exhaust device.

(Chamber 3)

The chamber 3 can accommodate the semiconductor substrate 2 therein. The semiconductor substrate 2 has a circular shape in a plan view.

(First Cooler 4)

The first cooler 4 is arranged inside the chamber 3. The first cooler 4 includes a first cooling plate 41 that can place a central portion 21 of the semiconductor substrate 2 thereon, as an example of a first placing portion. The first cooling plate 41 is formed of a thermally conductive material. For example, the first cooling plate 41 may be formed of a metal material, such as aluminum or stainless.

Figure 2:
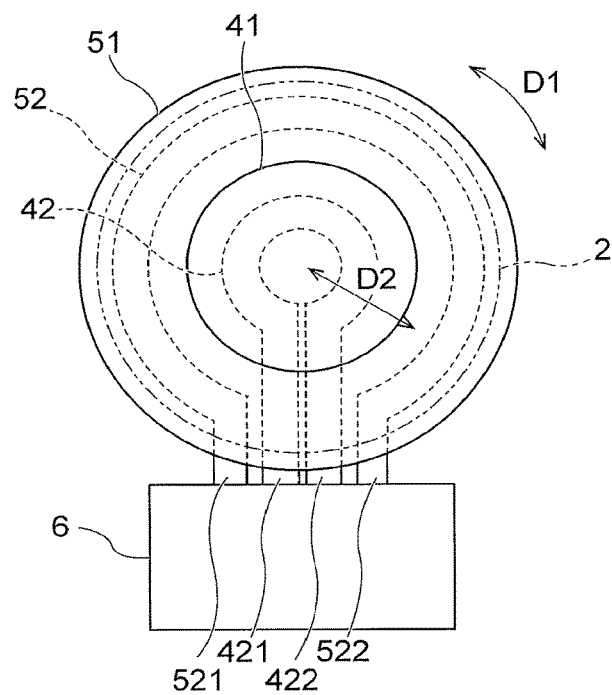
FIG. 2 is a plan view showing first and second coolers of the semiconductor manufacturing apparatus according to the first embodiment.

FIG. 2 is a plan view showing the first and second coolers 4 and 5 of the semiconductor manufacturing apparatus 1 according to the first embodiment. As shown in FIG. 2, the first cooling plate 41 is formed to have a circular plate shape in a plan view. A radius of the first cooling plate 41 is smaller than a radius of the semiconductor substrate 2. That is, the radius of the first cooling plate 41 is the same as the radius of the central portion 21 of the semiconductor substrate 2. Because the first cooling plate 41 has the same radius as the central portion 21, the central portion 21 of the semiconductor substrate 2 can be placed on the first cooling plate 41.

The radius of the first cooling plate 41, that is, the radius of the central portion 21 may be 0.33 to 0.87 times the radius of the semiconductor substrate 2. In a case where the radius of the first cooling plate 41 is smaller than 0.33 times the radius of the semiconductor substrate 2, it is difficult to quickly cool the semiconductor substrate 2. In a case where the radius of the first cooling plate 41 is larger than 0.87 times the radius of the semiconductor substrate 2, the temperature on a peripheral side of the semiconductor substrate 2, which tends to drop rapidly after a film-forming process, drops more rapidly than the temperature on a central side of the semiconductor substrate 2. Due to this tendency, cracks in the semiconductor substrate 2 may be caused by the temperature difference between the central side and the peripheral side of the semiconductor substrate 2.

Therefore, by setting the radius of the first cooling plate 41 to be 0.33 to 0.87 times the radius of the semiconductor substrate 2, improvement of the cooling efficiency of the semiconductor substrate 2 and suppression of cracks can be achieved at the same time. The radius of the semiconductor substrate 2 may be 150 millimeters. In this case, the radius of the first cooling plate 41 may be 50 to 130 millimeters.

The first cooler 4 cools the central portion 21 of the semiconductor substrate 2 placed on the first cooling plate 41 by heat exchange with the first cooling plate 41.

Specifically, as shown in FIG. 2, a first channel 42 is provided inside the first cooling plate 41, which is in contact with the first cooling plate 41. The first channel 42 has a shape along an outer peripheral edge of the first cooling plate 41. Specifically, the first channel 42 has a substantially annular shape in a plan view and is opposed to the central portion 21 substantially over the entire circumference of the central portion 21 of the semiconductor substrate 2.

As the first cooling plate 41 is cooled by a refrigerant flowing through the first channel 42, the central portion 21 of the semiconductor substrate 2 being in contact with the first cooling plate 41 can be cooled. Further, as the first channel 42 has a shape in accordance with the outer peripheral edge of the first cooling plate 41, the central portion 21 can be cooled uniformly in a circumferential direction D1. The first cooling plate 41 may also cool a peripheral portion 22 described later, which is not in contact with the first cooling plate 41 by thermal conduction via the central portion 21.

(Second Cooler 5)

The second cooler 5 is arranged inside the chamber 3. The second cooler 5 includes a second cooling plate 51 as an example of a second placing portion. The second cooling plate 51 can place the peripheral portion 22 of the semiconductor substrate 2 thereon in a periphery of the central portion 21.

Similarly to the first cooling plate 41, the second cooling plate 51 is formed of a thermally conductive material.

As shown in FIG. 2, the second cooling plate 51 is formed to have an annular plate shape that is concentric to the first cooling plate 41 in a plan view. The inner diameter of the second cooling plate 51 is slightly larger than the outer diameter of the first cooling plate 41, that is, the diameter of the central portion 21 of the semiconductor substrate 2. In the example of FIG. 2, the inner circumferential surface of the second cooling plate 51 is in contact with the outer circumferential surface of the first cooling plate 41. Due to the fact that the inner diameter of the second cooling plate 51 being larger than the central portion 21, it is possible to place the peripheral portion 22 of the semiconductor substrate 2, other than the central portion 21, on the second cooling plate 51.

The second cooler 5 cools the peripheral portion 22 of the semiconductor substrate 2 placed on the second cooling plate 51 by heat exchange with the second cooling plate 51.

Specifically, as shown in FIG. 2, a second channel 52 is provided inside the second cooling plate 51, which is in contact with the second cooling plate 51. The second channel 52 has a shape along an outer peripheral edge and an inner peripheral edge of the second cooling plate 51. In the example of FIG. 2, the second channel 52 has a substantially annular shape in a plan view. That is, the second channel 52 is opposed to the peripheral portion 22 of the semiconductor substrate 2 substantially over the entire circumference of the peripheral portion 22.

As the second cooling plate 51 is cooled by a refrigerant flowing through the second channel 52, the peripheral portion 22 of the semiconductor substrate 2 being in contact with the second cooling plate 51 can be cooled. Further, as the second channel 52 has a shape along the second cooling plate 51, the peripheral portion 22 can be cooled uniformly in the circumferential direction D1. The second cooling plate 51 may also cool the central portion 21 not being in contact with the second cooling plate 51 by thermal conduction via the peripheral portion 21.

(Chiller Unit 6)

The chiller unit 6 is arranged outside the chamber 3. In order to prevent cracks in the peripheral portion 22 caused by a temperature difference from the central portion 21, the chiller unit 6 controls the temperature of the second cooling plate 51 to be lower than the temperature of the semiconductor substrate 2 and to be higher than the temperature of the first cooling plate 41.

Specifically, the chiller unit 6 supplies a first refrigerant to the first channel 42. The chiller unit 6 also supplies a second refrigerant at a higher temperature than that of the first refrigerant to the second channel 52. The first refrigerant and the second refrigerant are water, for example.

More specifically, the chiller unit 6 is connected to an inlet 421 and an outlet 422 of the first channel 42. The chiller unit 6 repeats cooling of the first refrigerant while circulating the first refrigerant with the first channel 42. That is, the chiller unit 6 supplies the first refrigerant cooled to a first temperature lower than the temperature of the second refrigerant at an inlet 521 of the second channel 52, to the first channel 42 through the inlet 421. The chiller unit 6 also collects the first refrigerant after cooling the first cooling plate 41 from the outlet 422 and cools the collected first refrigerant to the first temperature.

The chiller unit 6 is also connected to the inlet 521 and an outlet 522 of the second channel 52. The chiller unit 6 repeats cooling of the second refrigerant while circulating the second refrigerant with the second channel 52. That is, the chiller unit 6 supplies the second refrigerant cooled to a second temperature higher than the temperature of the first refrigerant at the inlet 421 of the first channel 42, to the second channel 52 through the inlet 521. The chiller unit 6 also collects the second refrigerant after cooling the second cooling plate 51 from the outlet 522 and cools the collected second refrigerant to the second temperature.

The chiller unit 6 may be an air-cooled chiller unit that cools a refrigerant by heat exchange with cooled air, or may be a water-cooled chiller unit that cools a refrigerant by heat exchange with cooling water.

According to the chiller unit 6, even when the temperature of the peripheral portion 22 of the semiconductor substrate 2 has dropped to be low more rapidly than that of the central portion 21 after a film-forming process, it is possible to accelerate temperature drop in the central portion 21 that is at a higher temperature while suppressing temperature drop in the peripheral portion 22 that is at a lower temperature, by cooling the peripheral portion 22 at a higher temperature than that of the central portion 21. Due to this configuration, the temperature difference between the central portion 21 and the peripheral portion 22 is reduced. This reduction of the temperature difference between the central portion 21 and the peripheral portion 22 can prevent cracks in the semiconductor substrate 2.

(Pump 7)

The pump 7 is arranged outside the chamber 3. The pump 7 communicates with the inside of the chamber 3 at an exhaust port 31 provided in the chamber 3. The pump 7 evacuates the inside of the chamber 3 to make it in a vacuum state. By making the inside of the chamber 3 in a vacuum state, heat exchange between the internal space of the chamber 3 and the semiconductor substrate 2 can be suppressed. This enables temperature control of the central portion 21 by the first cooling plate 41 and temperature control of the peripheral portion 22 by the second cooling plate 51 to be executed with high accuracy.

(Cooling of Semiconductor Substrate 2)

When the semiconductor substrate 2 is cooled by the semiconductor manufacturing apparatus 1 having the above configuration, the inside of the chamber 3 is evacuated by the pump 7 to be made in a vacuum state. Also, by the chiller unit 6, water at the first temperature is supplied to the first cooling plate 41 and water at the second temperature higher than the first temperature is supplied to the second cooling unit 51. In this manner, the second cooling plate 51 is maintained at a higher temperature than that of the first cooling plate 41.

Subsequently, the semiconductor substrate 2 for which film formation has been performed is taken out from the inside of a film-forming chamber (not shown) by means of a transport mechanism (not shown), and the semiconductor substrate 2 taken out is placed on the first cooling plate 41 and the second cooling plate 51 in the chamber 3.

According to a simulation result of a corresponding relation between the position in a radial direction D2 in the semiconductor substrate 2 and the temperature at each position after film formation, the temperature drops more rapidly in the peripheral portion 22 than in the central portion 21 in the semiconductor substrate 2 after the film-forming process.

In a case where the temperature of the first cooling plate 41 and the temperature of the second cooling plate 51 are the same at the start of cooling, the temperature of the peripheral portion 22, which tends to drop rapidly, drops further rapidly. Because of this further rapid drop of the temperature in the peripheral portion 22, the temperature difference between the central portion 21 and the peripheral portion 22 becomes large. Such a large temperature difference between the central portion 21 and the peripheral portion 22 causes generation of tensile stress in the peripheral portion 22. Because of the tensile stress, the semiconductor substrate 2 tends to be easily cracked from a chipping, that is, a small defect formed in the peripheral portion 22.

On the other hand, according to the first embodiment, it is possible to maintain the second cooling plate 51 at a higher temperature than that of the first cooing plate 41 by setting the temperature of the water supplied to the second channel 52 to be higher than the temperature of the water supplied to the first channel 42. By maintaining the second cooling plate 51 at a higher temperature, it is possible to reduce the cooling rate of the peripheral portion 22 that is at a low temperature. Therefore, the temperature difference between the central portion 21 and the peripheral portion 22 can be reduced, and this results in reduction of generation of cracks in the semiconductor substrate 2 caused by the temperature difference.

Therefore, according to the first embodiment, it is possible to suppress occurrence of cracks in the semiconductor substrate 2 when the semiconductor substrate 2 is cooled after a high-temperature film-forming process.

(Modification)

Figure 3A:
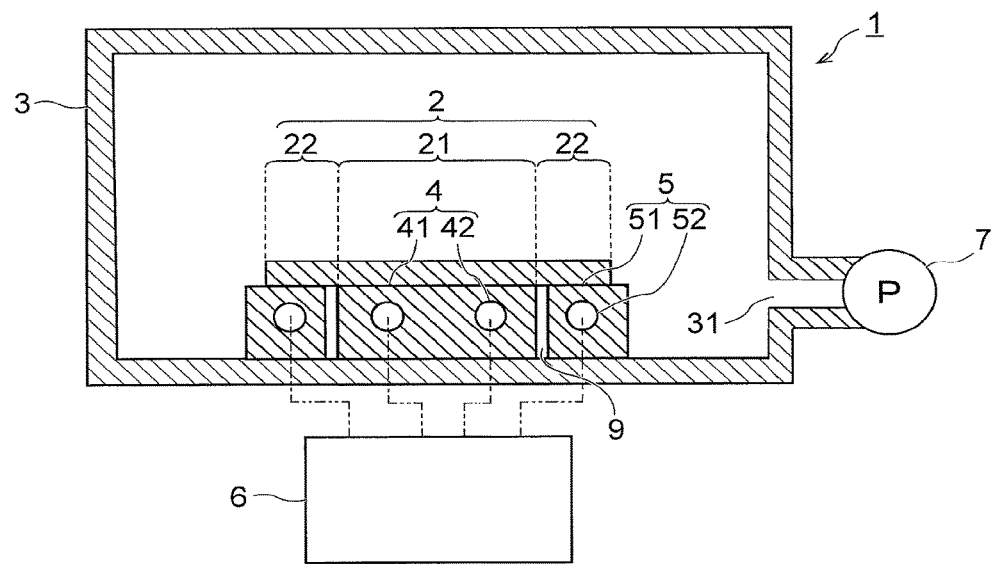
FIG. 3A is a schematic sectional view showing a semiconductor manufacturing apparatus according to a first modification of the first embodiment.
Figure 3B:
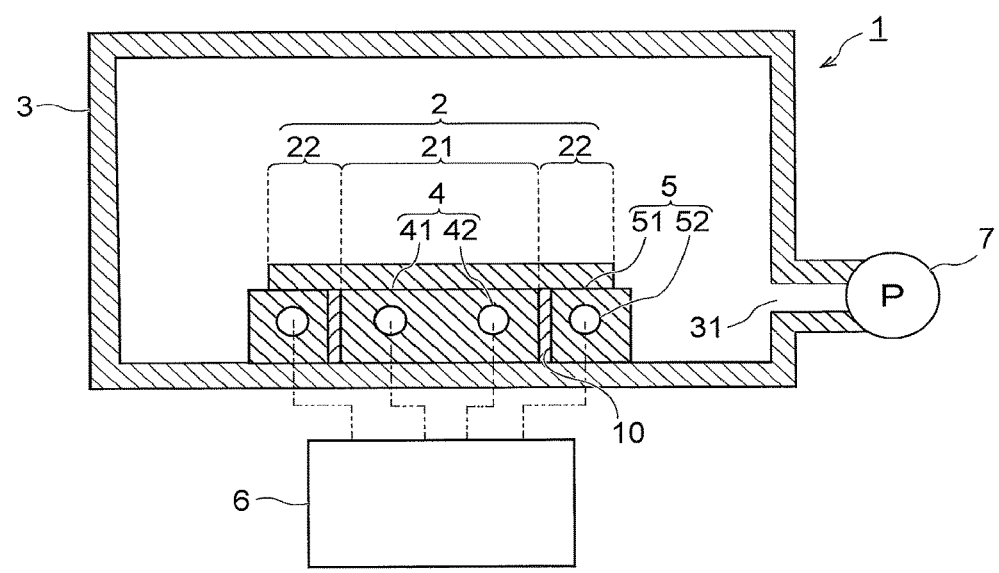
FIG. 3B is a schematic sectional view showing a semiconductor manufacturing apparatus according to a second modification of the first embodiment.

FIG. 3A is a schematic sectional view showing the semiconductor manufacturing apparatus 1 according to a first modification of the first embodiment. FIG. 3B is a schematic sectional view showing the semiconductor manufacturing apparatus 1 according to a second modification of the first embodiment.

In the configurations of FIGS. 1 and 2, the inner circumferential surface of the second cooling plate 51 is in contact with the outer circumferential surface of the first cooling plate 41. Meanwhile, as shown in FIG. 3A, an annular gap 9 may be provided between the outer circumferential surface of the first cooling plate 41 and the inner circumferential surface of the second cooling plate 51. Further, as shown in FIG. 3B, an annular member 10 having a poorer thermal conductivity than those of the cooling plates 41 and 51, for example, an insulating member, may be provided between the outer circumferential surface of the first cooling plate 41 and the inner circumferential surface of the second cooling plate 51. The thicknesses of the gap 9 and the member 10 in the radial direction D2 (see FIG. 2) may be 1 to 3 millimeters, for example.

With the configurations of FIGS. 3A and 3B, heat transfer between the first cooling plate 41 and the second cooling plate 51 can be suppressed. Due to the suppression of heat transfer, it is possible to surely control the first cooling plate 41 and the second cooling plate 51 to have a mutually different temperature. This can surely reduce the temperature difference between the central portion 21 and the peripheral portion 22, and can surely suppress generation of cracks in the semiconductor substrate 2 caused by the temperature difference. Further, because a satisfactory level of thermal insulation between the first cooling plate 41 and the second cooling plate 51 is ensured, it is possible to constitute the first cooling plate 41 and the second cooling plate 51 by a material having a large coefficient of the thermal conductivity in order to improve the thermal conductivity to the semiconductor substrate 2. This configuration can improve the cooling efficiency of the semiconductor substrate 2.

Second Embodiment

Next, as a second embodiment, there is described an embodiment in which only a central portion of a semiconductor substrate is brought into contact with a cooler, and the semiconductor substrate is cooled by thermal conduction in accordance with the coefficient of the thermal conductivity of a material of the cooler. In the second embodiment, constituent elements corresponding to those of the first embodiment are denoted by like reference characters and redundant explanations thereof will be omitted.

Figure 4:
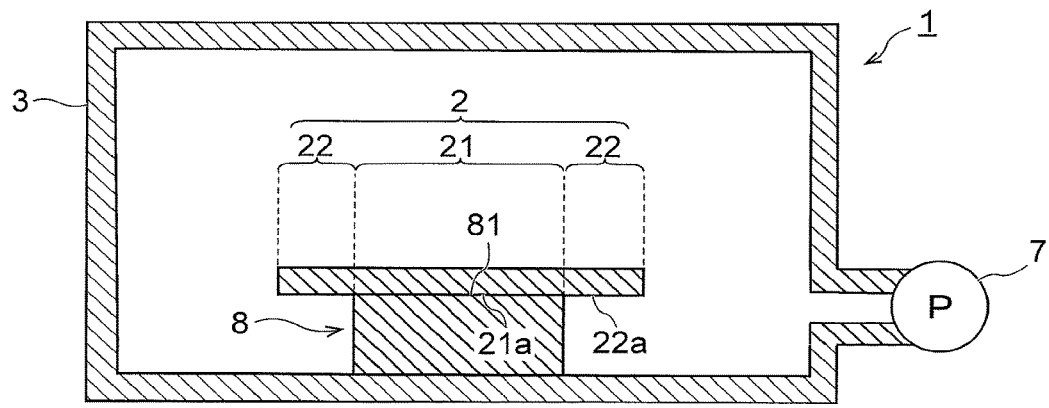
FIG. 4 is a schematic sectional view showing a semiconductor manufacturing apparatus according to a second embodiment.

FIG. 4 is a schematic sectional view of the semiconductor manufacturing apparatus 1 according to the second embodiment. As shown in FIG. 4, the semiconductor manufacturing apparatus 1 according to the second embodiment includes a cooler 8 in place of the first cooler 4 and the second cooler 5 described in the first embodiment.

The cooler 8 includes a cooling plate 81 as an example of a placing portion. The cooling plate 81 corresponds to a configuration obtained by removing the first channel 42 from the first cooling plate 41 according to the first embodiment. Specifically, the cooling plate 81 has an outer circumference smaller than an outer circumference of the semiconductor substrate 2. That is, the cooling plate 81 has a smaller radius than the semiconductor substrate 2.

The cooling plate 81 can place the central portion 21 of the semiconductor substrate 2 thereon inside the chamber 3. The cooler 8 cools the central portion 21 of the semiconductor substrate 2 by heat exchange with the cooling plate 81 while a bottom surface 22a of the peripheral portion 22 of the semiconductor substrate 2 is exposed.

In the second embodiment, the central portion 21 of the semiconductor substrate 2 being in contact with the cooling plate 81 is cooled by thermal conduction in accordance with the coefficient of the thermal conductivity of a material of the cooling plate 81 more rapidly than the peripheral portion 22.

A bottom surface 21a of the central portion 21 is in contact with the cooling plate 81, whereas the bottom surface 22a of the peripheral portion 22 is not in contact with the cooling plate 81. Further, although the bottom surface 22a of the peripheral portion 22 is in contact with vacuum, the coefficient of the thermal conductivity of vacuum is lower than the coefficient of the thermal conductivity of the cooling plate 81. Therefore, the temperature of the peripheral portion 22 not being in contact with the cooling plate 81 hardly drops, as compared with the central portion 21 being in contact with the cooling plate 81. Due to this configuration, similarly to the first embodiment, it is possible to reduce the cooling rate of the peripheral portion 22 that is at a low temperature after a film-forming process.

Therefore, according to the second embodiment, similarly to the first embodiment, the temperature difference between the central portion 21 and the peripheral portion 22 can be reduced. Therefore, it is possible to suppress generation of cracks in the semiconductor substrate 2 caused by the temperature difference.

Furthermore, in contrast to the first embodiment, in the second embodiment, the second cooling plate 51, the channels 42 and 52, and the chiller unit 6 can be omitted. Therefore, the number of components and the cost can be reduced.

Third Embodiment

Next, as a third embodiment, there is described an embodiment in which only a central portion of a semiconductor substrate is brought into contact with a cooler, and the semiconductor substrate is cooled by a refrigerant flowing through the cooler. In the third embodiment, constituent elements corresponding to those of the first embodiment are denoted by like reference characters and redundant explanations thereof will be omitted.

Figure 5:
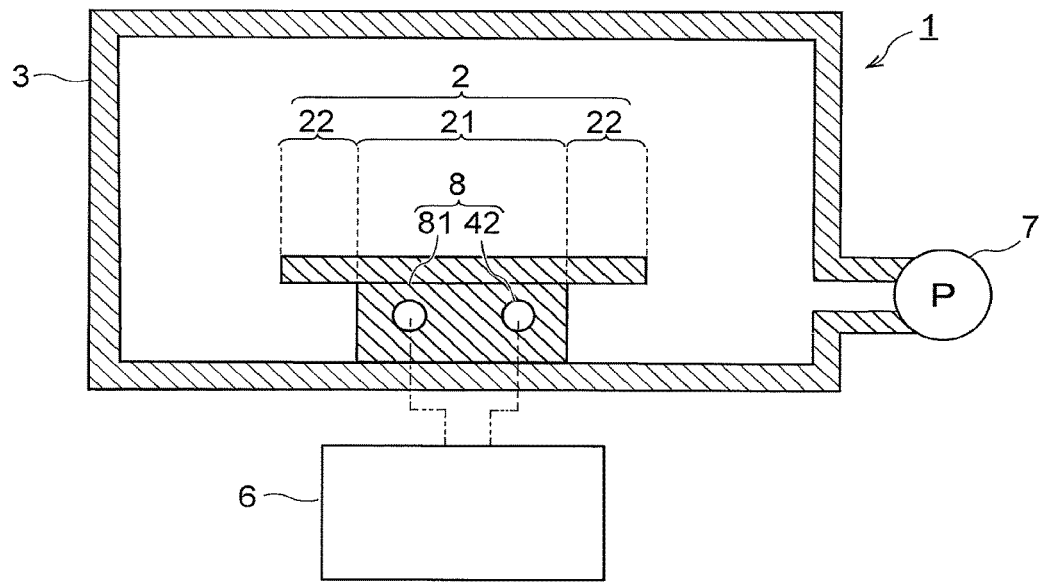
FIG. 5 is a schematic sectional view showing a semiconductor manufacturing apparatus according to a third embodiment.

FIG. 5 is a schematic sectional view of a semiconductor manufacturing apparatus 1 according to a third embodiment. As shown in FIG. 5, the semiconductor manufacturing apparatus 1 according to the third embodiment corresponds to a configuration in which the first channel 42 according to the first embodiment is arranged inside the cooling plate 81 according to the second embodiment, and the chiller unit 6, which is an example of a supplier, is connect to the first channel 42.

In the third embodiment, by bringing the central portion 21 of the semiconductor substrate 2 into contact with the cooling plate 81 cooled by a refrigerant, the semiconductor substrate 2 is cooled in such a manner that the temperature drops more rapidly in the central portion 21 than in the peripheral portion 22.

Similarly to the first embodiment, this configuration can reduce the cooling rate of the peripheral portion 22 where the temperature tends to drop rapidly after a film-forming process.

Accordingly, similarly to the first embodiment, according to the third embodiment, it is possible to reduce the temperature difference between the central portion 21 and the peripheral portion 22. Therefore, it is possible to suppress generation of cracks in the semiconductor substrate 2 caused by the temperature difference.

Furthermore, in contrast to the first embodiment, in the third embodiment, the second cooling plate 51 and the second channel 52 can be omitted. Therefore, the number of components and the cost can be reduced.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor manufacturing apparatus comprising:
a first placing portion having a circular shape in a plan view, having a flat surface and being formed of metal; and
a second placing portion having an annular shape that is concentric to the first placing portion in a plan view, being in a periphery of the first placing portion, being separated from the first placing portion, having a flat surface, being formed of metal and having a same height as the first placing portion; and
a temperature controller, wherein
an inner circumferential surface of the second placing portion is in contact with an outer circumferential surface of the first placing portion,
a seam is present between the first placing portion and the second placing portion, the seam being visible in a plan view, the seam comprising the first placing portion and the second placing portion directly adjacent to each other,
a first channel is disposed along an outer peripheral edge of the first placing portion,
a second channel is disposed along at least one of an inner peripheral edge and an outer peripheral edge of the second placing portion, and
the temperature controller controls a temperature of a first fluid flowing to the first channel and a second fluid flowing to the second channel, supplies a first refrigerant to the first channel and supplies a second refrigerant at a higher temperature than the first refrigerant to the second channel.

2. The apparatus of claim 1, wherein
the first channel passes through the outer circumferential surface of the first placing portion and the inner circumferential surface of the second placing portion, and is exposed to an outside of the first placing portion and the second placing portion from the outer circumferential surface of the second placing portion, and the second channel is exposed to the outside of the first placing portion and the second placing portion from a side surface of the second placing portion.

3. The apparatus of claim 1, wherein a radius of the first placing portion is in a range of 50-130 mm.

* * * * *